United States Patent [19]

Rippey

[11] Patent Number: 5,151,611
[45] Date of Patent: Sep. 29, 1992

[54] PROGRAMMABLE DEVICE FOR INTEGRATED CIRCUITS

[75] Inventor: Scott R. Rippey, Carney, Md.

[73] Assignee: Westinghouse Electric Corp., Pittsburgh, Pa.

[21] Appl. No.: 625,242

[22] Filed: Dec. 10, 1990

[51] Int. Cl.⁵ .............................................. H05K 7/00
[52] U.S. Cl. ................................. 307/202.1; 361/392; 361/394; 361/400; 361/417
[58] Field of Search ..................... 307/202.1; 361/392, 361/394, 400, 417, 419, 430, 431, 426, 406, 413, 415

[56] References Cited

U.S. PATENT DOCUMENTS

| | | | |
|---|---|---|---|
| 3,313,986 | 4/1967 | Kilby | 361/394 |
| 4,490,775 | 12/1984 | Quan | 361/400 X |
| 4,716,547 | 12/1987 | Baskett et al. | 365/96 |
| 4,723,155 | 2/1988 | Uchida | 357/51 X |
| 4,730,129 | 3/1988 | Kunitoki et al. | 307/202.1 |
| 4,811,167 | 3/1989 | Rippey et al. | 361/392 X |
| 5,010,445 | 4/1991 | Weinold | 361/392 |

*Primary Examiner*—Eugene R. LaRoche
*Assistant Examiner*—Son Dinh
*Attorney, Agent, or Firm*—T. H. Martin

[57] ABSTRACT

A programmable termination device includes an insulating body member and a plurality of pins to be inserted into an integrated circuit board. A plurality of circuit terminating elements are provided in the insulating body member, and a plurality of programmable fuses are provided for selectively connecting each of the circuit terminating elements to, or isolating each of the terminating elements from, the corresponding pins. The programmable fuses can be "blown" or left "intact" to program the device into the desired terminating configuration. An integrated circuit is "piggy-backed" over the programmable termination device into the same holes of the integrated circuit board as the pins of the programmable termination device.

12 Claims, 6 Drawing Sheets

PROGRAMMABLE DEVICE FOR INTEGRATED CIRCUITS

BACKGROUND OF THE INVENTION

The present invention relates to a programmable device for integrated circuits, and more specifically, to a programmable device operatively connected to an integrated circuit (IC) to provide signal termination or predetermined logic levels to logic elements in the IC.

Certain types of digital logic integrated circuits require termination circuits for satisfactory operation. Proper termination prevents reflections and ringing. For example, emitter coupled logic (ECL) and transistor transistor logic (TTL) drivers are typically terminated by a resistor or resistor network which is connected to a predetermined voltage level. In parallel termination, an IC logic gate is connected to a junction point between two series connected resistors. In diode termination, a pair of inverse parallel diodes serve as the terminating network.

In typical IC board layouts, the required terminating components are provided by single in-line package resistor packs, dual in-line package resistor packs or discrete resistors or diodes. In each case, significant amounts of IC board space are required.

One device for eliminating the need for separate space-consuming circuit terminating packs or discrete elements is disclosed in U.S. Pat. No. 4,811,167 entitled "Integrated Circuit Socket," of which applicant is a co-inventor.

U.S. Pat. No. 4,811,167 discloses an IC socket comprising an insulating member and a plurality of pins for connection to an electrical integrated circuit board. The top of the insulating member includes conductive sockets adapted to be electrically connected to the pins of an IC inserted therein in "piggy-back" fashion. A plurality of impedance elements are provided within the insulating member, and switches are provided on the insulating member for selectively connecting each of the impedance elements to, or isolating each of the impedance elements from a corresponding socket pin.

The IC socket disclosed in U.S. Pat. No. 4,811,167 is highly advantageous in that it eliminates the need for separate space-consuming circuit terminating packs or discrete elements on the IC board. The IC socket is provided beneath the IC and does not require additional board space. However, the use of mechanical switches on the IC socket requires the IC socket to have a higher profile than may be desirable in some applications. Further, in some applications, for example, many military applications, mechanical switches do not meet given specifications and are not acceptable.

SUMMARY OF THE INVENTION

Accordingly, it is an object of the present invention to provide a programmable termination device which does not require mechanical switches.

It is another object of the present invention to provide a programmable termination device having a significantly reduced profile.

It is another object of the present invention to provide a programmable termination network employing "fuse-link" technology.

It is another object of the present invention to provide a programmable device to be electrically connected to an IC and located beneath the IC on an IC board for providing predetermined logic levels to gates included in the IC.

Additional objects and advantages of the invention will be set forth in the description which follows, and in part will be apparent from the description, or may be learned by practice of the invention. The objects and advantages of the invention may be realized and obtained by means of the instrumentalities and combinations particularly pointed out in the appended claims.

To achieve the foregoing objects, and in accordance with the purposes of the invention, a programmable termination device is provided, comprising: an insulating body member; a plurality of pins extending from the insulating body member; a plurality of circuit terminating elements provided in the insulating body member, one circuit terminating element corresponding to each of predetermined ones of the plurality of pins; and a plurality of programmable fuses provided in said insulating body member, each of the plurality of programmable fuses being connected between a corresponding one of the plurality of circuit terminating elements and a corresponding one of the predetermined ones of the plurality of pins.

To further achieve the foregoing objects, and in accordance with the purposes of the invention, a programmable network to be electrically connected to an integrated circuit and to be physically located beneath the integrated circuit on an integrated circuit board for providing predetermined logic levels to gates included in the integrated circuit is provided, comprising: an insulating body member; a plurality of pins extending from the insulating body member; a plurality of resistive members having a first and second end, one resistive member corresponding to each of predetermined ones of the plurality of pins, the second end of the one resistive member connected to a second voltage source; a plurality of programmable fuses, two of the programmable fuses corresponding to each of the predetermined ones of the plurality of pins, a first end of a first one of the two programmable fuses being connected to the corresponding pin, a second end of the first one of the two programmable fuses being connected to a first end of the corresponding resistive member, a first end of a second one of the two programmable fuses being connected to a first voltage source, and a second end of the second one of the two programmable fuses being connected to the first end of the resistive member.

BRIEF DESCRIPTION OF THE DRAWINGS

The accompanying drawings, which are incorporated in and constitute a part of the specification, illustrate a presently-preferred embodiment of the invention which, together with the general description given above and the detailed description of the preferred embodiment given below, serve to explain the principles of the invention. Of the drawings.

DETAILED DESCRIPTION OF THE PREFERRED EMBODIMENT

The present invention utilizes "fuse-link" technology to achieve the objects an advantages of the present invention. Typically "fuse-link" technology is used in programmable ICs, in which circuit elements are linked by very small fuses. The IC is programmed by "blowing" predetermined ones of these fuses to configure the circuit as desired. This programming is typically done by a commercially available programmer which exposes each fuse to be "blown" to a sufficiently high voltage. A "blown" fuse opens the connection between corresponding circuit elements.

Figure 1:
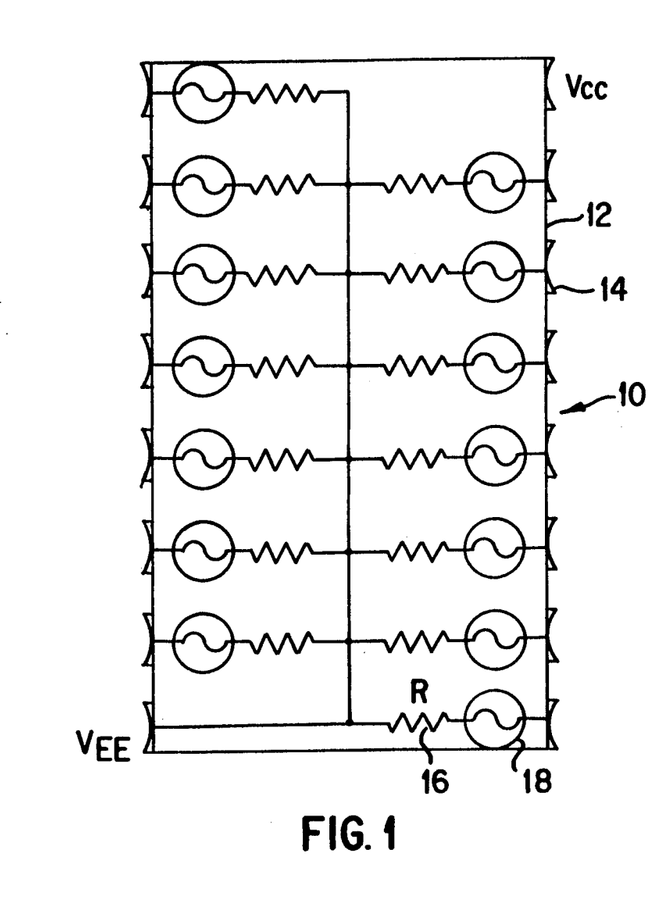
FIG. 1 is a schematic diagram of a programmable termination device in accordance with one embodiment of the present invention.

FIG. 1 shows a schematic diagram of a programmable termination device in accordance with one embodiment of the invention. The programmable termination device 10 comprises an insulating body member 12 and a plurality of pins 14 on both sides of the insulating body member 12. In accordance with the present invention, a plurality of circuit terminating elements are provided in the insulating body member. As embodied in FIG. 1, circuit terminating elements 16 comprise resistors R. Also in accordance with the present invention, a plurality of programmable fuses are provided in the insulating body member. As embodied in FIG. 1, programmable fuses 18 provide connections between circuit terminating elements 16 and pins 14. The other end of each or the circuit terminating elements 16 is connected to a supply voltage $V_{EE}$. $V_{EE}$ is typically −5.2 volts for ECL designs and ground for TTL and complementary metal oxide semiconductor (CMOS) designs.

Figure 2:
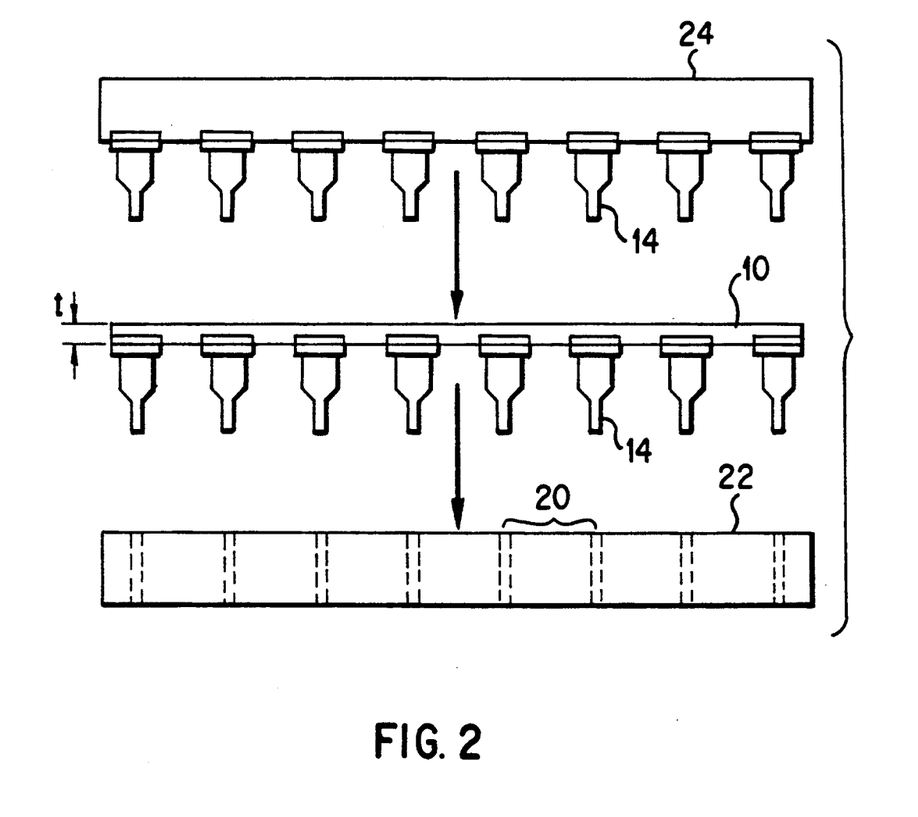
FIG. 2 illustrates the "piggy-back" coupling of an IC to a programmable termination device in accordance with one embodiment of the invention.

FIG. 2 illustrates a "piggy-back" (i.e. one on top of the other) connection of an IC to a programmable termination device in accordance with one embodiment of the invention. Pins 14 of the programmable termination device 10 are inserted into holes 20 of the IC board 22. Pins 14 of an associated IC 24 are inserted into the same holes 20 in the IC board 22 as pins 14 of the programmable termination device 10. This "piggy-back" coupling is enabled as a result of the low profile (thickness (t)) of the programmable termination device 10. The low profile of the programmable termination device 10 is a result of the use of programmable fuses 18 in the insulating body member 12 of the programmable termination device 10. Selection of the programmable fuses 18 is based on known circuit parameters such as current and heat capacities. Programmable fuses have different thicknesses depending on these parameters, which influences the overall profile of the programmable termination device.

Although the pins 14 of the programmable termination device 10 shown in FIG. 1 are concave, alternatively, the pins 14 may be flat, but must be thin enough to accommodate pins 14 of the IC 24 in the holes 20 of the IC board 22.

In an alternative embodiment, the programmable termination device 10 may comprise conductive openings in the insulating body member 12 similar to the openings shown in FIG. 1 of U.S. Pat. No. 4,811,167. In this embodiment, the pins 14 of the integrated circuit 24 can be coupled to the pins 14 of the programmable termination device 10 through the holes in the insulating body member 12.

In accordance with the invention, the programmable fuses can be selectively "blown" to disconnect the appropriate gates of the associated IC from the corresponding circuit terminating element in the programmable termination device. A programmable fuse which is not "blown" or remains "intact" couples the corresponding gate of the IC to the corresponding circuit terminating element in the programmable termination device.

Figure 3:
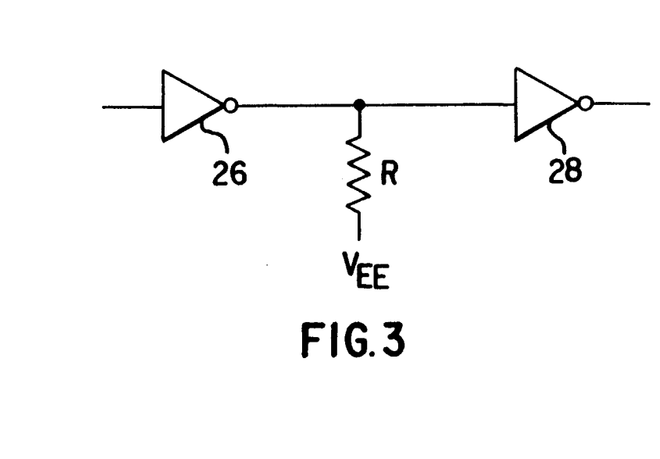
FIG. 3 is a circuit diagram illustrating the resistive circuit termination provided by the programmable termination device embodied in FIG. 1.

The circuit terminating configuration shown in FIG. 1 provides a "series termination," which is one of the most common types of ECL circuit terminations. This is illustrated in the circuit diagram of FIG. 3. In this case, the corresponding programmable fuse 18 has not been "blown" and the circuit terminating element 16 is electrically connected in series between a predetermined supply voltage $V_{EE}$ and a junction point between the output of a first logic gate 26 and the input of a second logic gate 28 of the IC 24. Preferably, termination is provided at the furthest point from the output gate 26 and avoids the problem of "detouring" the signal track to another termination location before rerouting to the input gate 28 of the integrated circuit 24.

Programming of the programmable termination device 10 is provided by applying an appropriate voltage to the programmable fuses 18 to be "blown" using any of the commercially-available fuse-link technology programming devices in accordance with conventional techniques. For example, the UNISITE 40 programmer, manufactured by the Data I/O Corporation, is a multi-purpose programmer capable of being configured to "blow" the desired fuses.

Although not shown in FIG. 1, an ultraviolet erasing window can be included in the insulating body member 12 of the programmable termination device 10 to allow reprogramming of the programmable termination device 10. In this embodiment, the programmable fuses 18 must be reprogrammable using ultraviolet light.

Figure 4:
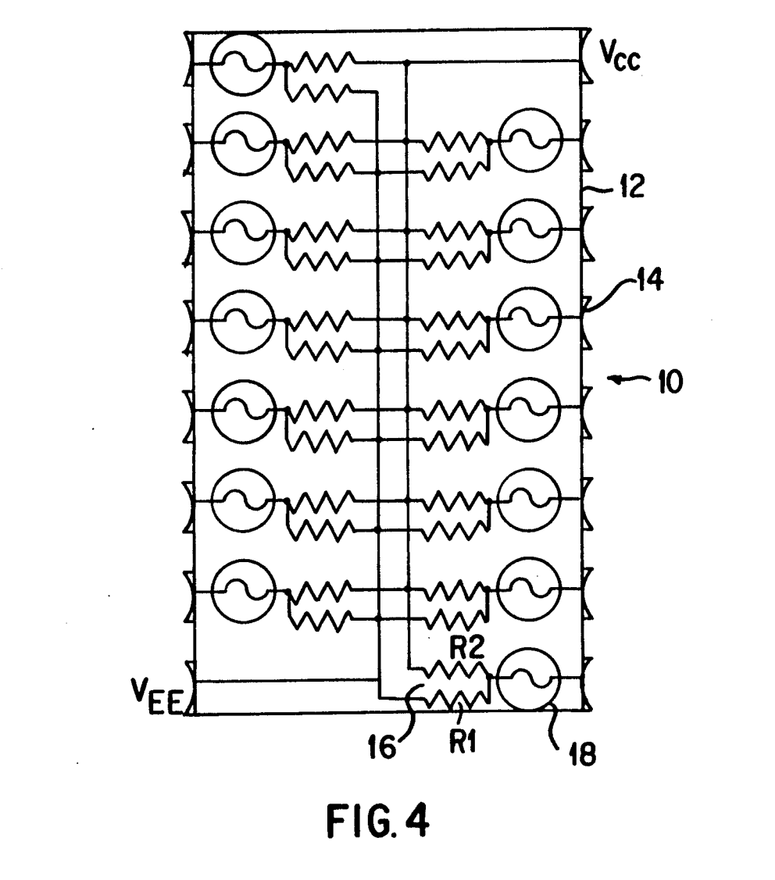
FIG. 4 is a schematic diagram of a programmable termination device in accordance with another embodiment of the present invention.
Figure 5:
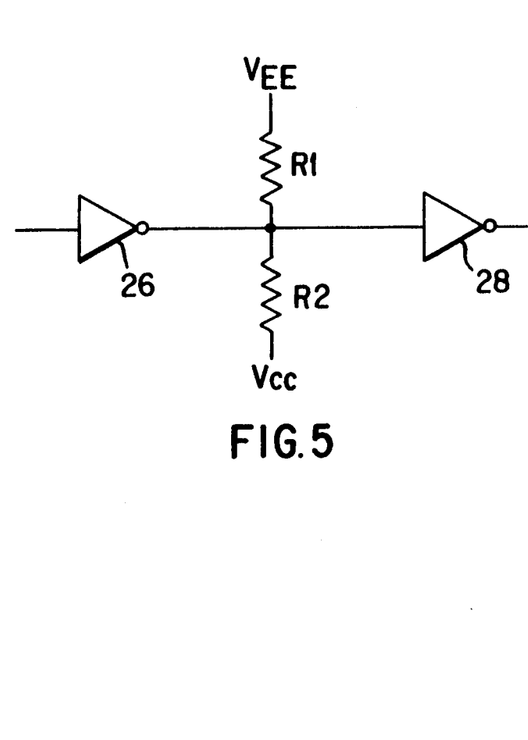
FIG. 5 is a circuit diagram illustrating the resistive circuit termination provided by the programmable termination device embodied in FIG. 4.

The termination configuration shown in the programmable termination device of FIG. 4 is typically called a parallel termination configuration. In this configuration, the circuit terminating element 16 comprises resistors R1 and R2 which are electrically connected in series between supply voltages $V_{EE}$ and $V_{CC}$ when the programmable fuse 18 is "intact." This is illustrated, for example, in FIG. 5 where the output of logic gate 26 and the input of logic gate 28 of the IC 24 are connected to a junction point between resistors R1 and R2 of the programmable termination device 10. Typically, $V_{CC}$ is ground for ECL designs and 5.0 volts for CMOS and TTL designs.

Figure 6:
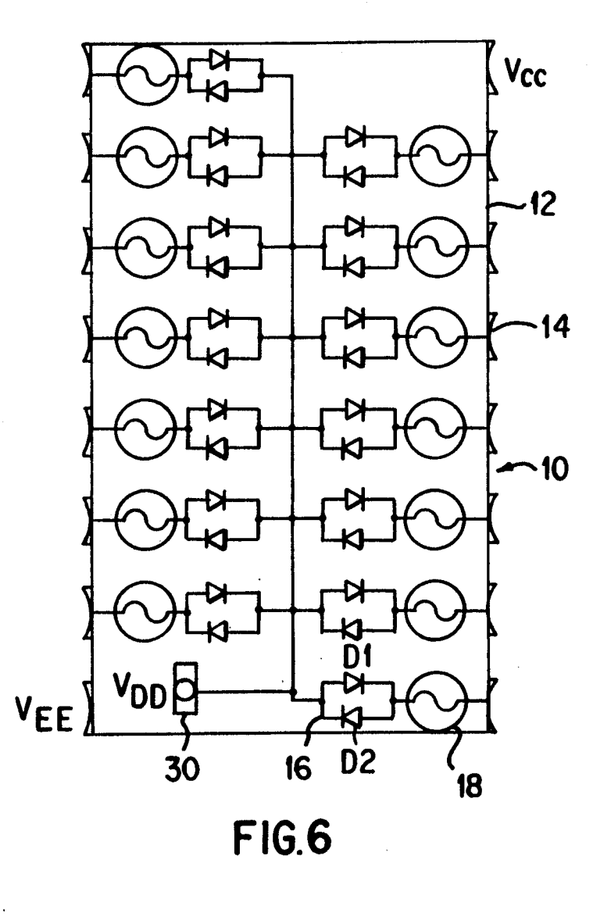
FIG. 6 is a schematic diagram of a programmable termination device in accordance with another embodiment of the present invention.
Figure 7:
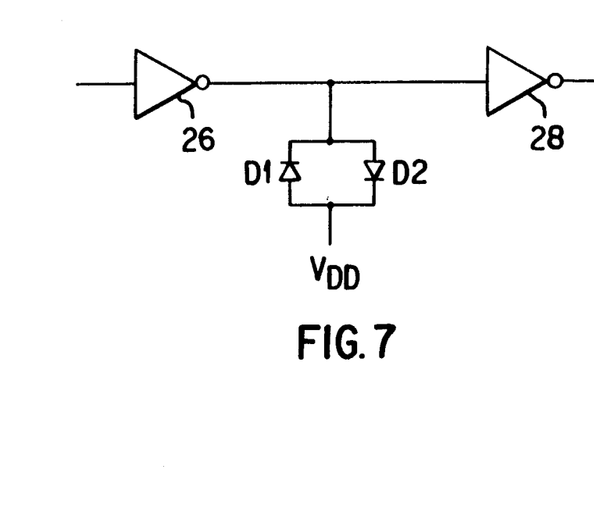
FIG. 7 is a circuit diagram illustrating the diode circuit termination provided by the programmable termination device embodied in FIG. 6.

The terminating configuration shown in FIG. 6 illustrates a typical diode termination configuration. In this configuration, the circuit terminating element 16 comprises diodes D1 and D2. As shown in FIG. 7, the diodes D1 and D2 are electrically connected in inverse parallel pairs between a voltage source $V_{DD}$ and a junction point between output gate 26 and input gate 28 of the IC 24 when the programmable fuse 18 is "intact." In this embodiment, as shown in FIG. 6, an extra pin 30 is provided in the programmable termination device 10 to supply the voltage $V_{DD}$ to the circuit terminating elements 16. $V_{DD}$ is typically $-1.3$ volts.

Figure 8:
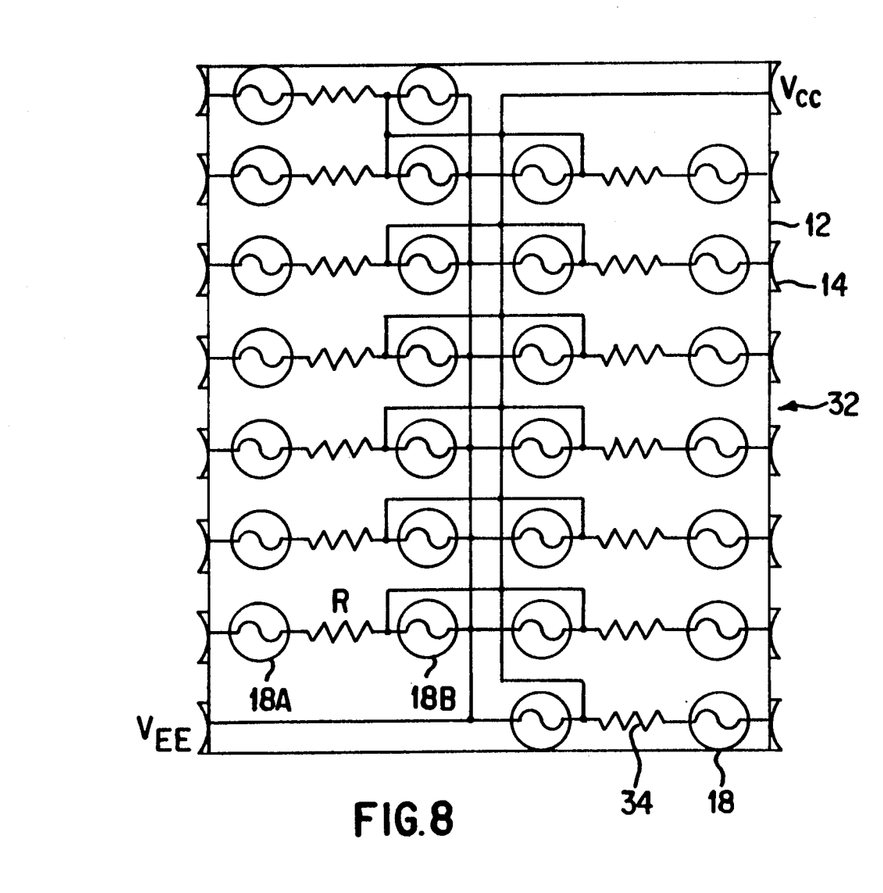
FIG. 8 is a schematic diagram of a programmable device for applying predetermined logic levels to an IC in accordance with one embodiment of the present invention.

In accordance with the present invention, a programmable device is provided to be electrically connected to an IC for providing predetermined logic levels to gates included in the IC. FIG. 8 illustrates one embodiment of such a programmable device. The programmable device shown in FIG. 8, preferably a TTL or CMOS design, is disposed beneath an IC on an IC board and ties inputs to the IC to either logic high or low levels without the need for external "pull-up" resistors and without the need to dedicate input pins of the IC to a ground plane. A TTL logic high level is typically $>2.4$ volts, and a TTL logic low level is typically $<0.8$ volts. A CMOS logic high level is typically $>3.5$ volts, and a CMOS logic low level is typically $<1.5$ volts.

Figure 9:
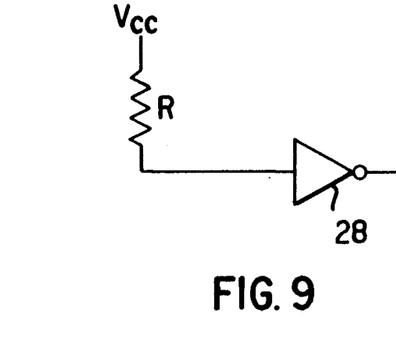
FIG. 9 is a circuit diagram illustrating the application of one logic level to a gate of an IC provided by the programmable device embodied in FIG. 8.
Figure 10:
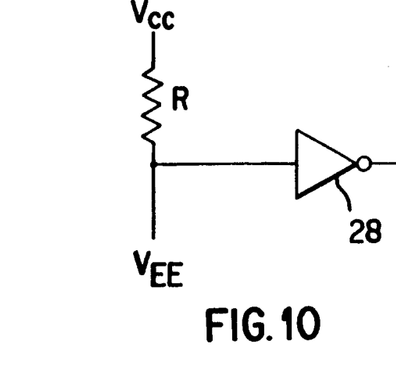
FIG. 10 is a circuit diagram illustrating the application of another logic level to a gate of an IC provided by the programmable device embodied in FIG. 8.

The programmable device 32 shown in FIG. 8 is comprised of an insulating body member 12 having a plurality of pins 14, similar to the programmable termination devices shown in FIGS. 1, 4 and 6. The programmable device 32 also includes a plurality of programmable fuses 18 and a plurality of resistors 34. Two programmable fuses 18A and 18B and one resistor R correspond to each pin 14 of the programmable device 32. A first end of programmable fuse 18A is connected directly to the corresponding pin 14, a second end of programmable fuse 18A is connected to a first end of the resistor R. A first end of the programmable fuse 18B is connected to voltage source $V_{EE}$, and a second end of the programmable fuse 18B is connected to a first end of the resistor R. The second end of the resistor R is connected to voltage source $V_{CC}$. If fuse 18A is left "intact" and programmable fuse 18B is "blown," the corresponding pin 14 of the programmable device 32 is provided with logic high level. As a result, as illustrated in FIG. 9, the input of logic gate 28 of the IC 24 is provided with this logic high level from voltage source $V_{CC}$ through resister R. If both fuses 18A and 18B are left "intact," the corresponding pin 14 of the programmable device 32 is provided with a logic low level. As a result, as illustrated in FIG. 10, the input of logic gate 28 of the IC 24 is provided with this low logic level. Similar to the programmable termination devices of FIGS. 1, 4 and 6, if fuse 18A is "blown," the corresponding pin 14 of the programmable device 32 is disconnected.

Figure 11:
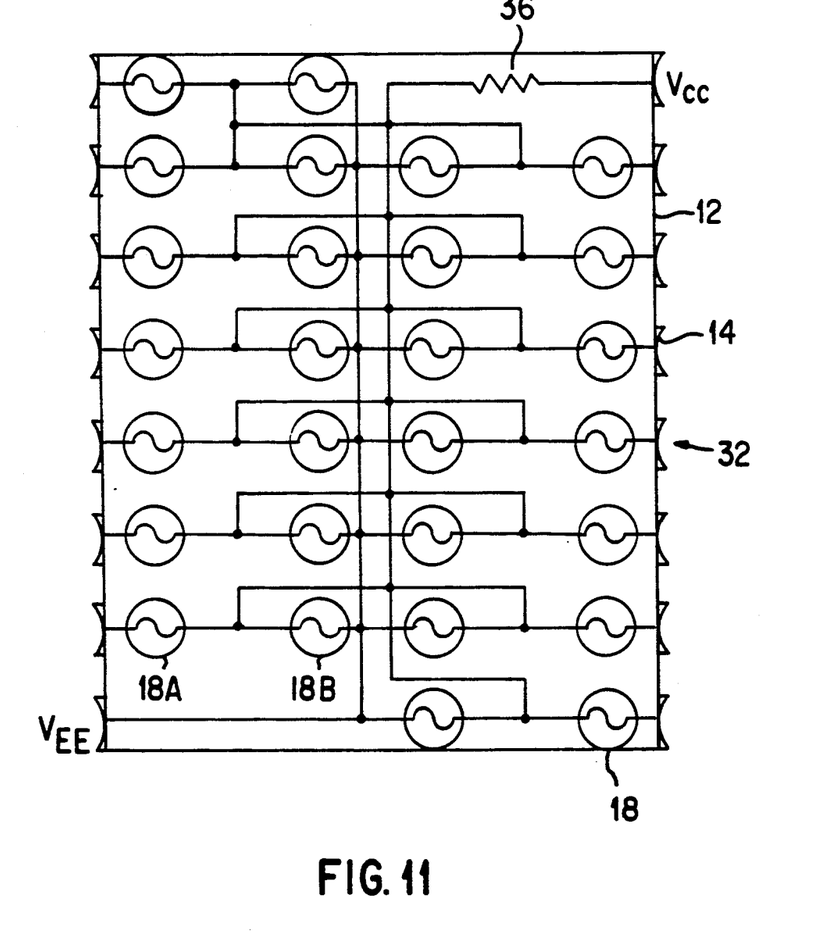
FIG. 11 is a schematic diagram of another programmable device for applying predetermined logic levels to an IC in accordance with another embodiment of the present invention.

FIG. 11 illustrates an alternative embodiment of a programmable device according to the present invention. The programmable device 32 illustrated in FIG. 11 also comprises an insulating body member 12 and pins 14, as well as a plurality of programmable fuses 18. However, only a single resistor 36 having a first and a second end is provided in the embodiment of FIG. 11. Two of the programmable fuses, 18A and 18B, correspond to each of the pins 14. A first end of programmable fuse 18A is connected directly to pin 14, and a second end of programmable fuse 18A is connected to a second end of programmable fuse 18B and to second end of resistor 36. The first end of programmable fuse 18B is connected to a voltage source $V_{EE}$, and the first end of the resistor 36 is connected to a second voltage source $V_{CC}$. The programmable device 32 shown in FIG. 11 is programmed in a manner similar to the other embodiments described herein. The blowing of programmable fuses 18A, 18B, or both, provides the same voltage conditions to the gates of a corresponding IC as the embodiment illustrated in FIG. 8 and described above.

While there has been illustrated and described what are at present considered to be preferred embodiments of the invention, it will be understood by those skilled in the art that various changes and modifications may be made, and equivalents may be substituted for elements described herein without departing from the true scope of the invention.

In addition, many modifications may be made to adapt a particular element, technique or implementation to the teachings of the present invention without departing from the central scope of the invention. Therefore, it is intended that this invention not be limited to the particular embodiments disclosed herein, but that the invention include all embodiments falling within the scope of the appended claims.

I claim:

1. A programmable device to be electrically connected to an integrated circuit and to be physically located beneath the integrated circuit on an integrated circuit board for providing predetermined logic levels to gates included in the integrated circuit, comprising:
   a first and second voltage source;
   an insulating body member;
   a plurality of pins extending from said insulating body member;
   a plurality of resistive members having a first and second end, one resistive member corresponding to each of predetermined ones of said plurality of pins, said second end of said one resistive member connected to said second voltage source; and
   a plurality of programmable fuses, two of said programmable fuses corresponding to each of said predetermined ones of said plurality of pins, wherein a first end of a first one of said two programmable fuses is connected to the corresponding pin, a second end of the first one of said two programmable fuses is connected to said first end of the corresponding resistive member, a first end of a second one of said two programmable fuses is connected to said first voltage source, and a second end of the second one of said two programmable fuses is connected to said first end of said resistive member.

2. A programmable device according to claim 1, wherein said plurality of programmable fuses can be "blown" by a programming device.

3. A programmable device according to claim 2, wherein when said first of said two of said programmable fuses is not "blown" and said second of said two of said programmable fuses is "blown," the corresponding pin is provided with a high logic level.

4. A programmable device according to claim 2, wherein when both said first and second of said two of said programmable fuses are not "blown," the corresponding pin is provided with a low logic level.

5. A programmable device according to claim 2, wherein when said first of said two of said programmable fuses is "blown," the corresponding pin is electrically disconnected from the corresponding resistive member.

6. A programmable device according to claim 1, wherein each of said plurality of pins is electrically connected to a corresponding pin of the integrated circuit.

7. A programmable device network to be electrically connected to an integrated circuit and to be physically located beneath the integrated circuit on an integrated circuit board for providing predetermined logic levels to gates included in the integrated circuit, comprising:
- an insulating body member;
- a plurality of pins extending from said insulating body member;
- a resistive member coupled at a first end to a first voltage source;
- a plurality of programmable fuses, two of said programmable fuses corresponding to each of predetermined ones of said plurality of pins, wherein a first end of a first one of said two programmable fuses is connected to the corresponding pin, a second end of the first one of said two programmable fuses is connected to a second end of the resistive member, a first end of a second one of said two programmable fuses is connected to a second voltage source, and a second end of the second one of said two programmable fuses is connected to a second end of the resistive member and to the second end of the first one of said two programmable fuses.

8. A programmable device according to claim 7, wherein said plurality of programmable fuses can be "blown" by a programming device.

9. A programmable device according to claim 8, wherein when said first of said two of said programmable fuses is not "blown" and said second of said two of said programmable fuses is "blown," the corresponding pin is provided with a high logic level.

10. A programmable device according to claim 8, wherein when both said first and second of said two of said programmable fuses are not "blown," the corresponding pin is provided with a low logic level.

11. A programmable device according to claim 8, wherein when said first of said two of said programmable fuses is "blown," the corresponding pin is electrically disconnected from the corresponding resistive member.

12. A programmable device according to claim 7, wherein each of said plurality of pins is electrically connected to a corresponding pin of the integrated circuit.

* * * * *